United States Patent
Zanbaghi (10) Patent No.: US 10,734,981 B1
(45) Date of Patent: Aug. 4, 2020

(54) DIRECT DRIVER VOLTAGE TO RAMP SIGNAL GENERATION

(71) Applicant: Cirrus Logic International Semiconductor Ltd., Edinburgh (GB)

(72) Inventor: Ramin Zanbaghi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/660,100

(22) Filed: Oct. 22, 2019

(51) Int. Cl.
  *H03K 4/50* (2006.01)
  *H03F 1/56* (2006.01)
  *H03K 7/08* (2006.01)

(52) U.S. Cl.
  CPC .............. *H03K 4/50* (2013.01); *H03F 1/56* (2013.01); *H03K 7/08* (2013.01)

(58) Field of Classification Search
  CPC .............. H03K 4/50; H03K 7/08; H03F 1/56
  See application file for complete search history.

(56) References Cited

U.S. PATENT DOCUMENTS

| | | | |
|---|---|---|---|
| 7,053,806 B1* | 5/2006 | Rao ................. | H03M 1/1028 341/118 |
| 8,803,569 B1* | 8/2014 | Malladi ............ | H03K 4/066 327/131 |
| 9,319,033 B1* | 4/2016 | Jin ................... | H03K 4/502 |

* cited by examiner

*Primary Examiner* — John W Poos
(74) *Attorney, Agent, or Firm* — Jackson Walker L.L.P.

(57) ABSTRACT

A method for generating a periodic ramp waveform may include in a sampling phase of each period of operation of a ramp-generation circuit, sampling a reference voltage onto a sampling capacitor. The method may also include in a transfer phase of each period of operation of the ramp-generation circuit: discharging the reference voltage from the sampling capacitor through at least one resistor to generate a current and generating the periodic ramp waveform by integrating the current with at least one integrating capacitor, wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase.

18 Claims, 5 Drawing Sheets

DIRECT DRIVER VOLTAGE TO RAMP SIGNAL GENERATION

FIELD OF DISCLOSURE

The present disclosure relates in general to circuits for electronic devices, and more specifically, to a ramp generation circuit that provides for direct driver voltage to ramp signal generation.

BACKGROUND

Numerous devices, including without limitation personal audio devices, wireless telephones, such as mobile/cellular telephones, cordless telephones, mp3 players, and other consumer audio devices, often use one or more ramp generation circuits. In operation, such ramp generation circuits produce a periodic signal that, during each periodic cycle, ramps from a minimum magnitude (e.g., zero) to a maximum magnitude. In some instances, a ramp signal generated by a ramp-generation circuit may be used by a pulse-width modulator to generate a pulse-width modulated signal, as is known in the art.

Figure 1:
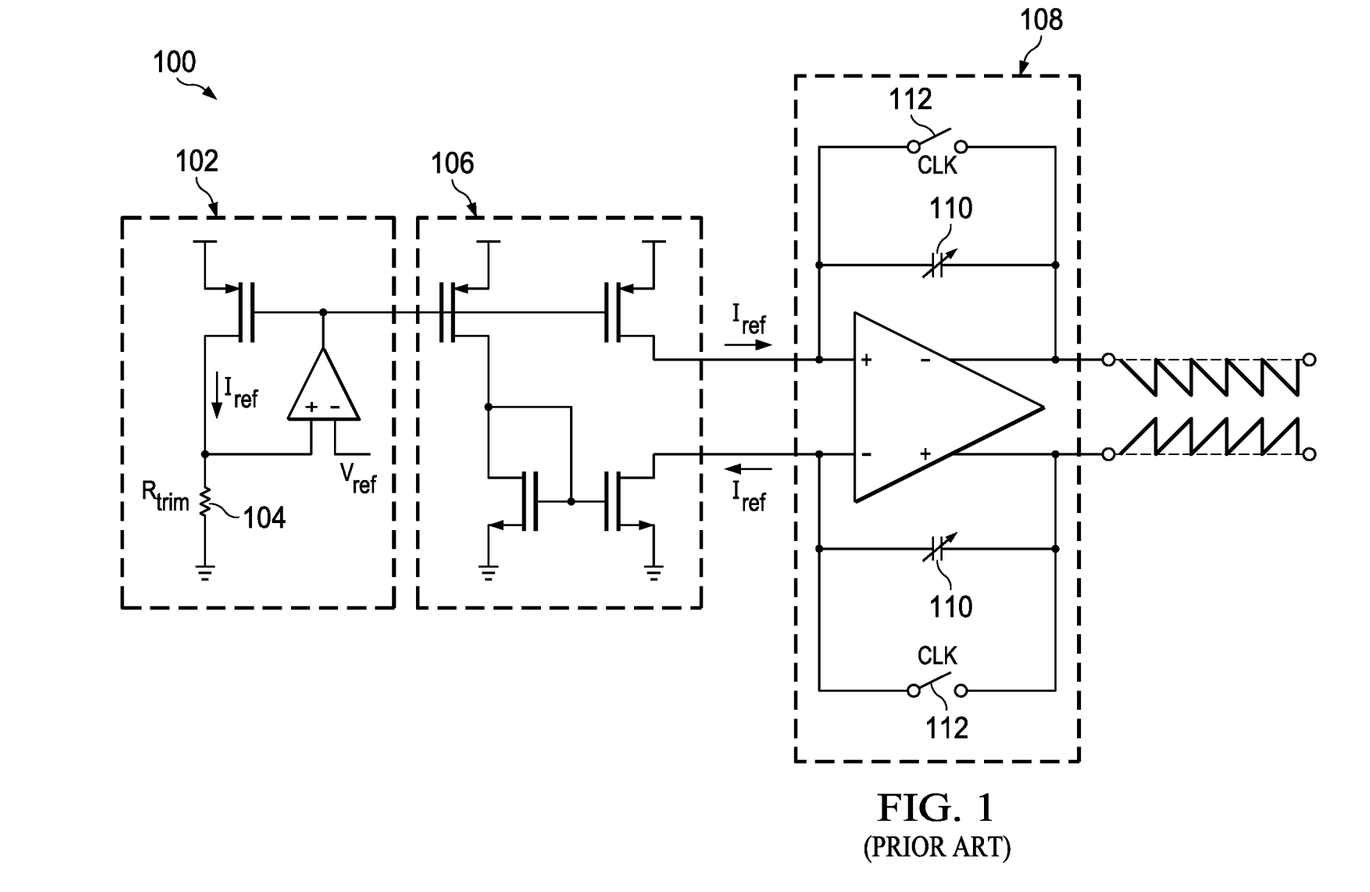
FIG. 1 illustrates an example ramp-generation circuit, as is known in the art.

FIG. 1 depicts an example ramp-generation circuit 100, as is known in the art. As shown in FIG. 1, ramp-generation circuit 100 may include a reference-current generation subcircuit 102 for generating a reference current $I_{ref}=V_{ref}/R_{trim}$, where $V_{ref}$ is a reference voltage and $R_{trim}$ is a resistance of a resistor 104 of reference-current generation subcircuit 102. Ramp-generation circuit 100 may also include a current-mirror stage 106 that sources an amplifier input current proportional to reference current $I_{ref}$ to a positive input terminal of output amplifier stage 108 and sinks an amplifier input current of identical magnitude from a negative input terminal of output amplifier stage 108. Such amplifier input currents may flow through feedback capacitors 110 of equal capacitance, integrating charge during each cycle of ramp-generation circuit 100 to generate, at each output terminal of output amplifier stage 108, a sawtooth ramp signal, which is reset to its minimum voltage (e.g., zero) during each cycle boundary of ramp-generation circuit 100 as a result of periodic activation of switches 112 by clock signal CLK.

Ramp-generation circuit 100 of FIG. 1 may have numerous disadvantages. For example, in the topology of FIG. 1, reference voltage $V_{ref}$ is converted into reference current $I_{ref}$ that is mirrored through current-mirror stage 106 to generate push-pull reference current sources to be integrated on feedback capacitors 110, which provide a voltage-domain output. Therefore, the topology of FIG. 1 has a voltage-to-current conversion, generation of push-pull currents, and then current-to-voltage conversion. These multiple conversion steps may add significant error in ramp generation, especially error due to process, voltage, temperature, and component mismatch. Thus, ramp-generation circuit 100 may also be unable to track changes in process, frequency, temperature, and/or supply voltage. As another example, the resistance $R_{trim}$ of resistor 104 may require trimming to account for process variations of ramp-generation circuit 100, which adds cost and design complexity to ramp-generation circuit 100. In addition, as is the case in any circuit, it may be desirable to provide similar functionality to ramp-generation circuit 100 but with fewer electrical and electronic components, in order to minimize circuit size and/or power consumption.

SUMMARY

In accordance with the teachings of the present disclosure, one or more disadvantages and problems associated with existing approaches to generating a ramp signal may be reduced or eliminated.

In accordance with embodiments of the present disclosure, a method for generating a periodic ramp waveform may include in a sampling phase of each period of operation of a ramp-generation circuit, sampling a reference voltage onto a sampling capacitor. The method may also include in a transfer phase of each period of operation of the ramp-generation circuit: discharging the reference voltage from the sampling capacitor through at least one resistor to generate a current and generating the periodic ramp waveform by integrating the current with at least one integrating capacitor, wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase.

In accordance with embodiments of the present disclosure, a ramp-generation circuit may include an input sampling network configured to, in a sampling phase of each period of operation of the ramp-generation circuit, sample a reference voltage onto a sampling capacitor of the input sampling network. The ramp-generation circuit may also include an output integrating network configured to, in a transfer phase of each period of operation of the ramp-generation circuit, discharge the reference voltage from the sampling capacitor through at least one resistor of the output integrating network to generate a current and generate the periodic ramp waveform by integrating the current with at least one integrating capacitor of the output integrating network, wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase.

In accordance with these and other embodiments of the present disclosure, a pulse-width modulating circuit may include a ramp-generation circuit and a comparator. The ramp-generation circuit may include an input sampling network configured to, in a sampling phase of each period of operation of the ramp-generation circuit, sample a reference voltage onto a sampling capacitor of the input sampling network. The ramp-generation circuit may also include an output integrating network configured to, in a transfer phase of each period of operation of the ramp-generation circuit, discharge the reference voltage from the sampling capacitor through at least one resistor of the output integrating network to generate a current and generate the periodic ramp waveform by integrating the current with at least one integrating capacitor of the output integrating network, wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase. The comparator may be configured to perform a comparison of the periodic ramp waveform to an input signal and generate a pulse-width modulated signal based on the comparison.

In accordance with these and other embodiments of the present disclosure, an amplifier may include an input configured to receive an input signal, an output configured to generate an output signal, and a signal path configured to generate the output signal as a function of the input signal The signal path may include a ramp-generation circuit and a comparator. The ramp-generation circuit may include an input sampling network configured to, in a sampling phase of each period of operation of the ramp-generation circuit, sample a reference voltage onto a sampling capacitor of the input sampling network. The ramp-generation circuit may also include an output integrating network configured to, in a transfer phase of each period of operation of the ramp-generation circuit, discharge the reference voltage from the sampling capacitor through at least one resistor of the output integrating network to generate a current and generate the periodic ramp waveform by integrating the current with at least one integrating capacitor of the output integrating network, wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase. The comparator may be configured to perform a comparison of the periodic ramp waveform to an input signal and generate a pulse-width modulated signal based on the comparison.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 2:
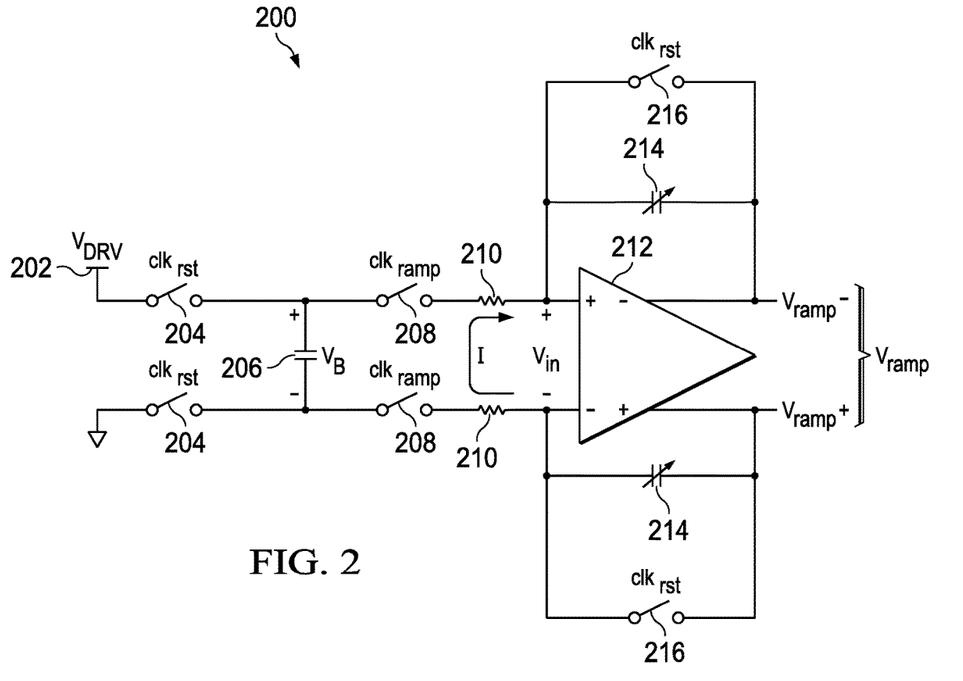
FIG. 2 illustrates an example ramp-generation circuit, in accordance with embodiments of the present disclosure.

FIG. 2 illustrates an example ramp-generation circuit 200, in accordance with embodiments of the present disclosure. Ramp-generation circuit 200 may overcome the one or more of the disadvantages of existing ramp-generation topologies as described in the Background section of this Application, as ramp-generation circuit 200, as described below, may provide for the direct application of voltage, thus reducing the number of conversion steps associated with traditional approaches, and with a topology more immune to sources of error from variations in process, voltage, temperature, and/or component matching.

As shown in FIG. 2, ramp-generation circuit 200 may include a voltage source 202 that generates a varying or fixed driving voltage $V_{DRV}$, a plurality of reset switches 204, a sampling capacitor 206, a plurality of transfer switches 208, a plurality of input resistors 210, an operational amplifier 212, a plurality of integrating capacitors 214, and a plurality of reset switches 216, arranged as shown in FIG. 2.

In particular, a reset switch 204 may be coupled between a first (e.g., rail voltage) terminal of voltage source 202 and a first terminal of sampling capacitor 206, and another reset switch 204 may be coupled between a second (e.g., ground) terminal of voltage source 202 and a second terminal of sampling capacitor 206. In addition, one series combination of a transfer switch 208 and an input resistor 210 may be coupled between the first terminal of sampling capacitor 206 and a first (e.g., positive) input terminal of operational amplifier 212 and another series combination of a transfer switch 208 and an input resistor 210 may be coupled between the second terminal of sampling capacitor 206 and a second (e.g., negative) input terminal of operational amplifier 212. One integrating capacitor 214 may be coupled in parallel with a reset switch 216 between the first (e.g., positive) input terminal of operational amplifier 212 and a first inverting (e.g., negative) output terminal of operational amplifier 212, and another integrating capacitor 214 may be coupled in parallel with another reset switch 216 between the second (e.g., negative) input terminal of operational amplifier 212 and a second inverting (e.g., positive) output terminal of operational amplifier 212.

Reset switches 204 and 216 may be controlled by a reset clock signal $clk_{rst}$ such that reset switches 204 and 216 are enabled (e.g., activated, closed, on) when reset clock signal $clk_{rst}$ is asserted and are disabled (e.g., deactivated, open, off) when reset clock signal $clk_{rst}$ is deasserted. Transfer switches 208 may be controlled by a ramp clock signal $clk_{ramp}$ such that transfer switches 208 are enabled (e.g., activated, closed, on) when ramp clock signal $clk_{ramp}$ is asserted and are disabled (e.g., deactivated, open, off) when ramp clock signal $clk_{ramp}$ is deasserted. In operation, reset clock signal $clk_{rst}$ and ramp clock signal $clk_{ramp}$ may be complementary (e.g., reset clock signal $clk_{rst}$ may be asserted when ramp clock signal $clk_{ramp}$ is deasserted, and vice versa).

Figure 3:
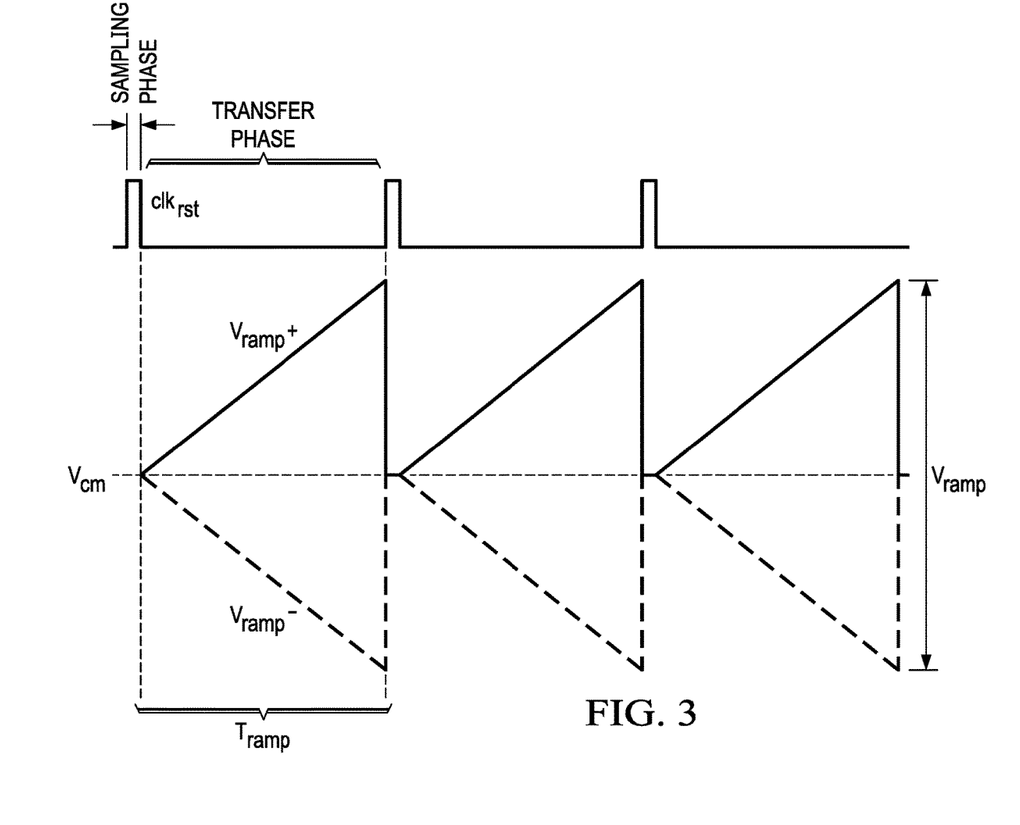
FIG. 3 illustrates example voltage waveforms at selected electrical nodes of the ramp-generation circuit depicted in FIG. 2, in accordance with embodiments of the present disclosure.

Ramp-generation circuit 200 may periodically operate such that each period of operation of ramp-generation circuit 200 includes two phases as illustrated in FIG. 3, which illustrates example voltage waveforms at selected electrical nodes of the ramp-generation circuit depicted in FIG. 2, in accordance with embodiments of the present disclosure. A first phase may comprise a sampling phase in which reset clock signal $clk_{rst}$ is asserted and ramp clock signal $clk_{ramp}$ is deasserted. During such sampling phase, reset switches 204 may be enabled and transfer switches 208 may be disabled, allowing a bulk voltage $V_B$ across the terminals of sampling capacitor 206 to charge to driving voltage $V_{DRV}$ via reset switches 204, thus sampling voltage $V_{DRV}$ onto sampling capacitor 206. In the sampling phase, reset switches 216 may also be enabled and may cause each integrating capacitor 214 to be shorted across its terminals by a respective reset switch 216, thus forcing the output terminal voltages $V_{ramp}{}^+$ and $V_{ramp}{}^-$ at the output terminals of operational amplifier 212 to a common mode voltage $V_{cm}$, and forcing a differential output voltage of the operational amplifier to zero. In some embodiments, rather than the "single-sampling" approach depicted in FIG. 2, another sampling capacitor in addition to sampling capacitor 206 may be used to perform doubling sampling.

A second phase may comprise a transfer phase in which reset clock signal $clk_{rst}$ is deasserted and ramp clock signal $clk_{ramp}$ is asserted. During such transfer phase, reset switches 204 and 216 may be disabled and transfer switches 208 may be enabled, allowing bulk voltage $V_B$ to discharge through input resistors 210 to generate a current I which may charge integrating capacitors 214 to increase voltage magnitudes across the terminals of each integrating capacitor 214. As shown in FIG. 3, such transfer phase may last for a duration of time $T_{ramp}$. Time $T_{ramp}$ may be selected to be a duration of time significantly shorter than (e.g., less than 10% of) a transient time constant ti defined by the capacitance of sampling capacitor 206 and the sum of the resistances of input resistors 210. With time $T_{ramp}$ selected to be significantly shorter than transient time constant $\tau$, discharge of charge from sampling capacitor 206 may be linear with respect to time during time $T_{ramp}$, meaning current I may be constant during time $T_{ramp}$, and voltages $V_{ramp}{}^+$, $V_{ramp}{}^-$, and $V_{ramp}$ are linear with respect to time, such that they generate linear ramp-like waveforms.

Figure 4:
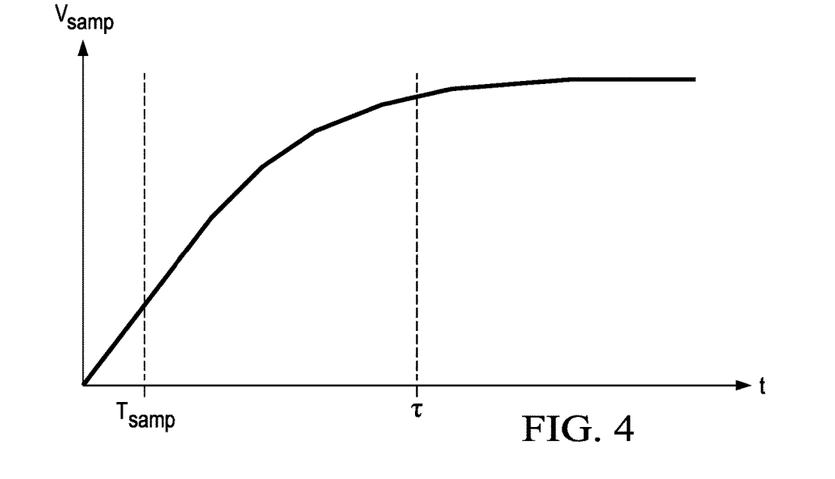
FIG. 4 illustrates an example transient voltage curve for a voltage across a sampling capacitor of a sampling network in response to a step waveform applied to an input of the sampling network, in accordance with embodiments of the present disclosure.

To further demonstrate, FIG. 4 illustrates an example transient voltage curve for a voltage $V_{samp}$ across a sampling capacitor of a sampling network in response to a step waveform applied to an input of the sampling network. FIG. 4 shows that for sampling periods $T_{samp}$ much less than transient time constant $\tau$ for the sampling network, the sampling network will behave linearly, in that the charging of charge to (or discharging or charge from) the sampling capacitor may be approximately linear with respect to time.

Thus, turning back to FIGS. 2 and 3, with an approximately constant current I during duration $T_{ramp}$, the integration of charge on integrating capacitors 214 during duration $T_{ramp}$ may be linear, thus leading to a linear (e.g., constantly ramping) increase in magnitude of the respective output terminal voltages $V_{ramp}{}^+$ and $V_{ramp}{}^-$ during duration $T_{ramp}$, as shown in FIG. 3. Accordingly, during duration $T_{ramp}$, a differential output voltage of operation amplifier 212, the ramp voltage $V_{ramp}$, may ramp from zero to a maximum voltage. Because ramp-generation circuit 200 may operate in a periodic fashion alternating between the sampling phase and the transfer phase, ramp-generation circuit 200 may generate ramp voltage $V_{ramp}$ as a periodic ramp signal, as shown in FIG. 3.

To further illustrate operation of ramp-generation circuit 200, those of skill in the art will recognize that during a transfer phase of operation, current I may be given as:

$$I = \frac{V_{DRV}}{2R} e^{-\frac{t}{\tau}}$$

where R is a resistance of an input resistor 210, e is the constant of nature known as Euler's number, t is a time elapsed since the beginning of the transfer phase, $\tau$ is a transient time constant defined by:

$$\tau = 2RC_B$$

where $C_B$ is a capacitance of sampling capacitor 206.

Accordingly:

$$V_{ramp} = \frac{1}{C_I} \int_0^t I\, dt = \frac{V_{DRV}\tau}{2RC_I}\left(1 - e^{-\frac{t}{\tau}}\right)$$

where $C_I$ is a capacitance of each integrating capacitor 214.

For times t significantly less than transient time constant $\tau$:

$$V_{ramp} = \frac{V_{DRV}\tau}{2RC_I} \frac{t}{\tau} = \frac{V_{DRV}t}{2RC_I}$$

Assuming sampling capacitor 206 is not significantly discharged during each transfer phase, it may be fully recharged to driving voltage $V_{DRV}$ during each sampling phase. However, in the event that a sampling phase is insufficient to fully recharge sampling capacitor 206, ramp-generation circuit 200 may include two sampling capacitors 206 that are switched into discharging in alternating periods of ramp-generation circuit 200.

Accordingly, using the systems and methods disclosed herein, a source driving voltage of a ramp-generation circuit may be provided that directly converts a source driving voltage $V_{DRV}$ to push-pull currents for generating a periodic ramp signal, eliminating a need for reference current generation circuits and current mirroring circuits present in existing approaches to ramp-generation circuitry.

Ramp-generation circuit 200 may be used in any suitable manner. For example, in some embodiments, ramp-generation circuit 200 may be used in a circuit for generating a pulse-width modulation signal, such as an amplifier and/or quantizer, as shown in greater detail below.

Figure 5:
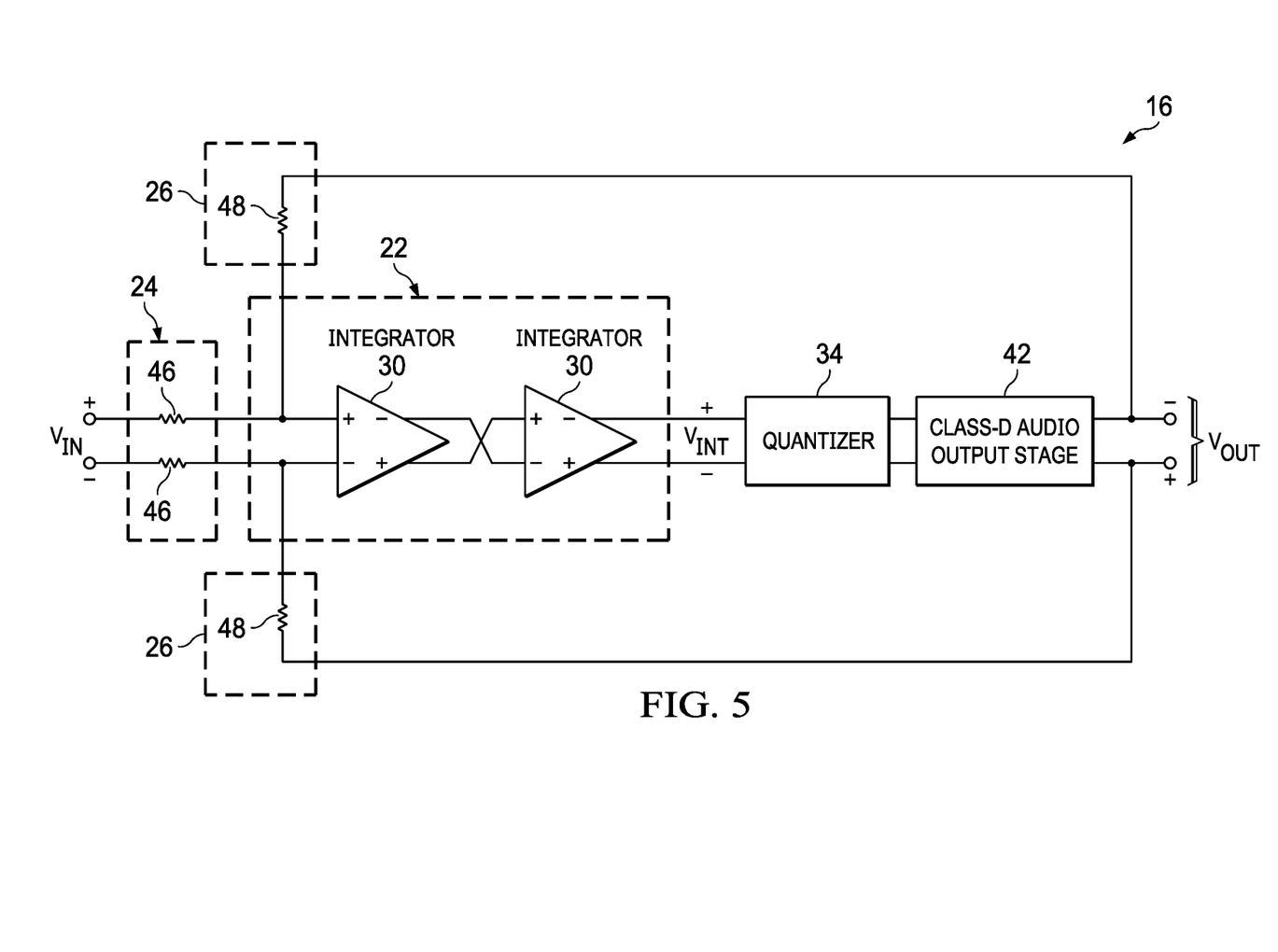
FIG. 5 illustrates a block diagram of selected components of an example amplifier, in accordance with embodiments of the present disclosure.

FIG. 5 illustrates a block diagram of selected components of an example amplifier 16, in accordance with embodiments of the present disclosure. As shown in FIG. 5, amplifier 16 may include a signal input network 24, a first stage 22 (e.g., an analog front end) configured to receive analog input signal $V_{IN}$ at an amplifier input of amplifier 16 and generate an intermediate signal $V_{INT}$ which is a function of analog input signal $V_{IN}$, a quantizer 34, a final output stage comprising a class-D audio output stage 42 configured to generate audio output signal $V_{OUT}$ at an amplifier output of amplifier 16 as a function of quantized intermediate signal $V_{INT}$, and a signal feedback network 26 coupled between the amplifier output and the amplifier input.

Signal input network 24 may include any suitable input network receiving the amplifier input of amplifier 16. For example, as shown in FIG. 5, signal input network 24 may include input resistors 46.

First stage 22 may include any suitable analog front end circuit for conditioning analog input signal $V_{IN}$ for use by class-D audio output stage 42. For example, first stage 22 may include one or more analog integrators 30 cascaded in series, as shown in FIG. 5.

Quantizer 34 may comprise any system, device, or apparatus configured to quantize intermediate signal $V_{INT}$ to generate an equivalent digital PWM signal.

Class-D audio output stage 42 may comprise any system, device, or apparatus configured to receive the output of quantizer 34 and drive an output signal $V_{OUT}$ which is an amplified version of analog input signal $V_{IN}$. Accordingly, class-D audio output stage 42 may comprise a plurality of output switches configured to generate output signal $V_{OUT}$ from a modulated signal generated by quantizer 34. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven by class-D audio output stage 42.

Signal feedback network 26 may include any suitable feedback network for feeding back a signal indicative of audio output signal $V_{OUT}$ to the amplifier input of amplifier 16. For example, as shown in FIG. 5, signal feedback network 26 may include variable feedback resistors 48. Those of skill in the art may recognize that a closed loop gain of amplifier 16 may be set by a ratio of the resistances of variable feedback resistors 48 to the resistances of variable input resistors 46.

Figure 6:
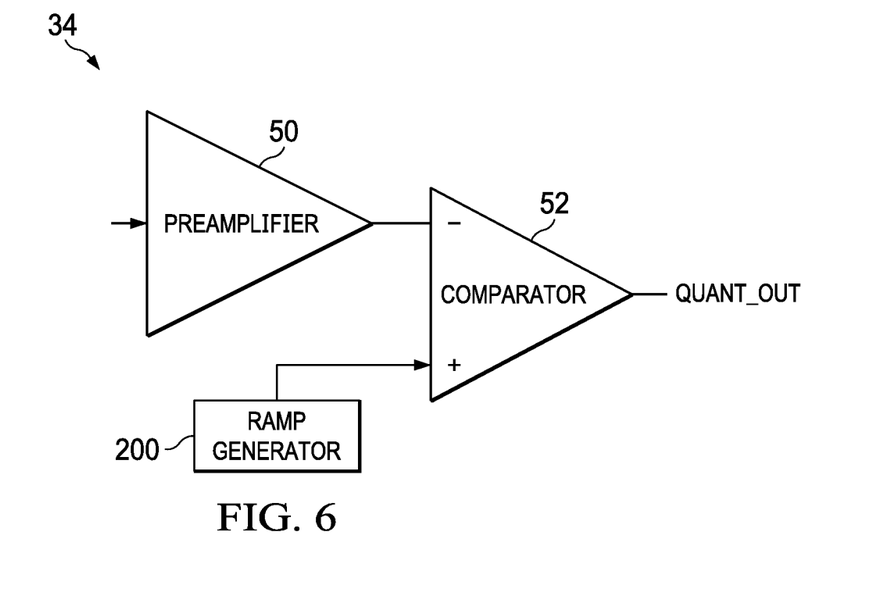
FIG. 6 illustrates a block diagram of selected components of an example quantizer, in accordance with embodiments of the present disclosure.

FIG. 6 illustrates a block diagram of selected components of an example quantizer 34, in accordance with embodiments of the present disclosure. As shown in FIG. 6, quantizer 34 may include a preamplifier 50 followed by a comparator 52 that may compare the output of preamplifier 50 to a periodic triangular waveform generated by ramp generation circuit 200 to generate a pulse-width modulated output signal QUANT_OUT from quantizer 34.

Figure 7:
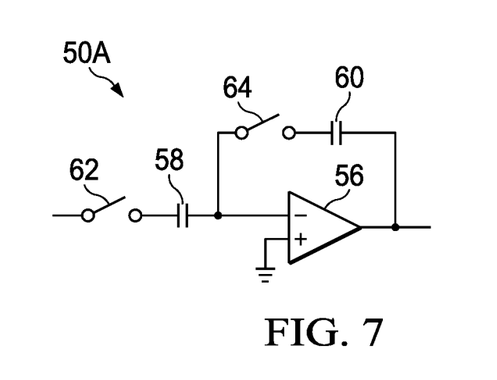
FIG. 7 illustrates a block diagram of selected components of one example preamplifier for a quantizer, in accordance with embodiments of the present disclosure.

FIG. 7 illustrates a block diagram of selected components of one example preamplifier 50A for quantizer 34, in accordance with embodiments of the present disclosure. In some embodiments, preamplifier 50A may be used to implement preamplifier 50 of FIG. 6. Preamplifier 50A may comprise a switched capacitor gain circuit including an operational amplifier 56 with an input switched capacitor comprising a capacitor 58 and a switch 62 and an output switched capacitor comprising a capacitor 60 and a switch 64, all arranged as shown in FIG. 7. A gain of preamplifier 50A may be set by a ratio between a capacitance of capacitor 60 and a capacitance of capacitor 58.

Figure 8:
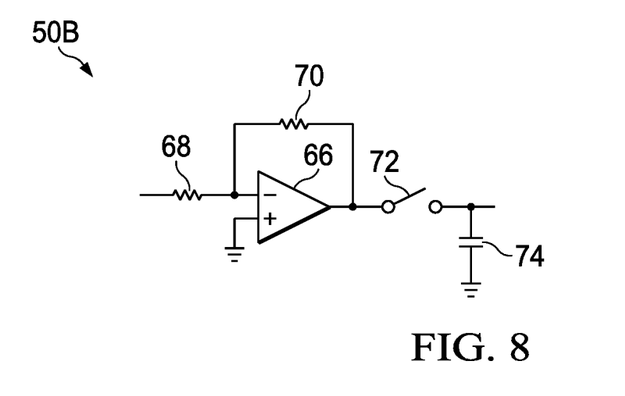
FIG. 8 illustrates a block diagram of selected components of another example preamplifier for a quantizer, in accordance with embodiments of the present disclosure.

FIG. 8 illustrates a block diagram of selected components of another example preamplifier 50B for quantizer 34, in accordance with embodiments of the present disclosure. In some embodiments, preamplifier 50B may be used to implement preamplifier 50 of FIG. 6. Preamplifier 50B may comprise a gain circuit including an operational amplifier 66 with an input resistor 68, a feedback resistor 70, and a sample-and-hold circuit comprising a capacitor 74 and a switch 72, all arranged as shown in FIG. 8. A gain of preamplifier 50B may be set by a ratio between a resistance of resistor 70 and a resistance of resistor 68.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for generating a periodic ramp waveform comprising:
   in a sampling phase of each period of operation of a ramp-generation circuit, sampling a reference voltage onto a sampling capacitor; and
   in a transfer phase of each period of operation of the ramp-generation circuit:
   discharging the reference voltage from the sampling capacitor through at least one resistor to generate a current; and
   generating the periodic ramp waveform by integrating the current with at least one integrating capacitor;
   wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase.

2. The method of claim 1, further comprising, during the sampling phase of each period of operation, resetting the at least one integrating capacitor to reset the periodic ramp waveform.

3. The method of claim 1, wherein:
the at least one resistor comprises:
   a first resistor coupled between a first terminal of the sampling capacitor and a first terminal of an operational amplifier; and
   a second resistor coupled between a second terminal of the sampling capacitor and a second terminal of an operational amplifier; and
the at least one integrating capacitor comprises:
   a first integrating capacitor coupled between the first terminal of the operational amplifier and a first inverting output of the operational amplifier; and
   a second integrating capacitor coupled between the second terminal of the operational amplifier and a second inverting output of the operational amplifier.

4. The method of claim 3, further wherein the periodic ramp waveform is a differential voltage waveform between the first inverting output and the second inverting output.

5. A ramp-generation circuit comprising:
an input sampling network configured to, in a sampling phase of each period of operation of the ramp-generation circuit, sampling a reference voltage onto a sampling capacitor of the input sampling network; and
an output integrating network configured to, in a transfer phase of each period of operation of the ramp-generation circuit:
   discharge the reference voltage from the sampling capacitor through at least one resistor of the output integrating network to generate a current; and
   generate the periodic ramp waveform by integrating the current with at least one integrating capacitor of the output integrating network;
   wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase.

6. The system of claim 5, wherein the output integrating network is further configured to, during the sampling phase of each period of operation, reset the at least one integrating capacitor to reset the periodic ramp waveform.

7. The system of claim 5, wherein:
the at least one resistor comprises:
   a first resistor coupled between a first terminal of the sampling capacitor and a first terminal of an operational amplifier; and
   a second resistor coupled between a second terminal of the sampling capacitor and a second terminal of an operational amplifier; and
the at least one integrating capacitor comprises:
   a first integrating capacitor coupled between the first terminal of the operational amplifier and a first inverting output of the operational amplifier; and
   a second integrating capacitor coupled between the second terminal of the operational amplifier and a second inverting output of the operational amplifier.

8. The system of claim 7, further wherein the periodic ramp waveform is a differential voltage waveform between the first inverting output and the second inverting output.

9. A pulse-width modulating circuit, comprising:
a ramp-generation circuit comprising:
   an input sampling network configured to, in a sampling phase of each period of operation of the ramp-generation circuit, sampling a reference voltage onto a sampling capacitor of the input sampling network; and
   an output integrating network configured to, in a transfer phase of each period of operation of the ramp-generation circuit:
      discharge the reference voltage from the sampling capacitor through at least one resistor of the output integrating network to generate a current; and
      generate the periodic ramp waveform by integrating the current with at least one integrating capacitor of the output integrating network;
      wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase; and
a comparator configured to perform a comparison of the periodic ramp waveform to an input signal and generate a pulse-width modulated signal based on the comparison.

10. The pulse-width modulating circuit of claim 9, wherein the output integrating network is further configured to, during the sampling phase of each period of operation, reset the at least one integrating capacitor to reset the periodic ramp waveform.

11. The pulse-width modulating circuit of claim 9, wherein:
the at least one resistor comprises:
   a first resistor coupled between a first terminal of the sampling capacitor and a first terminal of an operational amplifier; and
   a second resistor coupled between a second terminal of the sampling capacitor and a second terminal of an operational amplifier; and
the at least one integrating capacitor comprises:
   a first integrating capacitor coupled between the first terminal of the operational amplifier and a first inverting output of the operational amplifier; and
   a second integrating capacitor coupled between the second terminal of the operational amplifier and a second inverting output of the operational amplifier.

12. The pulse-width modulating circuit of claim 11, further wherein the periodic ramp waveform is a differential voltage waveform between the first inverting output and the second inverting output.

13. The pulse-width modulating circuit of claim 9, wherein the pulse-width modulating circuit comprises a quantizer.

14. An amplifier comprising:
an input configured to receive an input signal;
an output configured to generate an output signal; and
a signal path configured to generate the output signal as a function of the input signal, the signal path comprising:
   a ramp-generation circuit comprising:
      an input sampling network configured to, in a sampling phase of each period of operation of the ramp-generation circuit, sampling a reference voltage onto a sampling capacitor of the input sampling network; and an output integrating network configured to, in a transfer phase of each period of operation of the ramp-generation circuit:
  discharge the reference voltage from the sampling capacitor through at least one resistor of the output integrating network to generate a current; and
  generate the periodic ramp waveform by integrating the current with at least one integrating capacitor of the output integrating network;
  wherein a duration of the transfer phase is significantly smaller than a time constant defined by a capacitance of the sampling capacitor and a resistance of the at least one resistor, such that the reference voltage discharges linearly from the sampling capacitor as a function of time during the transfer phase; and
a comparator configured to perform a comparison of the periodic ramp waveform to the input signal and generate the output signal based on the comparison.

15. The amplifier of claim 14, wherein the output integrating network is further configured to, during the sampling phase of each period of operation, reset the at least one integrating capacitor to reset the periodic ramp waveform.

16. The amplifier of claim 14, wherein:
the at least one resistor comprises:
  a first resistor coupled between a first terminal of the sampling capacitor and a first terminal of an operational amplifier; and
  a second resistor coupled between a second terminal of the sampling capacitor and a second terminal of an operational amplifier; and
the at least one integrating capacitor comprises:
  a first integrating capacitor coupled between the first terminal of the operational amplifier and a first inverting output of the operational amplifier; and
  a second integrating capacitor coupled between the second terminal of the operational amplifier and a second inverting output of the operational amplifier.

17. The amplifier of claim 16, further wherein the periodic ramp waveform is a differential voltage waveform between the first inverting output and the second inverting output.

18. The amplifier of claim 14, wherein the ramp-generating circuit and the comparator are integral to a quantizer.

* * * * *

UNITED STATES PATENT AND TRADEMARK OFFICE
CERTIFICATE OF CORRECTION

PATENT NO. : 10,734,981 B1
APPLICATION NO. : 16/660100
DATED : August 4, 2020
INVENTOR(S) : Ramin Zanbaghi It is certified that error appears in the above-identified patent and that said Letters Patent is hereby corrected as shown below:

In the Specification

1. In Column 3, Line 3, delete "signal" and insert -- signal. --, therefor.

2. In Column 3, Line 50, delete "illustrates example" and insert -- illustrates an example --, therefor.

3. In Column 5, Line 28, delete "ti" and insert -- $\tau$ --, therefor.

4. In Column 5, Line 52, delete "operation amplifier" and insert -- operational amplifier --, therefor.

5. In Column 6, Line 15, delete "$C_t$" and insert -- $C_I$ --, therefor.

In the Claims

6. In Column 9, Line 46, in Claim 6, delete "system" and insert -- ramp-generation circuit --, therefor.

7. In Column 9, Line 50, in Claim 7, delete "system" and insert -- ramp-generation circuit --, therefor.

8. In Column 9, Line 65, in Claim 8, delete "system" and insert -- ramp-generation circuit --, therefor.

Signed and Sealed this
Twentieth Day of September, 2022

Katherine Kelly Vidal
*Director of the United States Patent and Trademark Office*